(12) United States Patent
Chang

(10) Patent No.: US 11,175,336 B2
(45) Date of Patent: Nov. 16, 2021

(54) SYSTEM AND METHOD OF AUTOMATED BURN-IN TESTING ON INTEGRATED CIRCUIT DEVICES

(71) Applicant: KingTiger Technology (Canada) Inc., Markham (CA)

(72) Inventor: Sunny Lai-Ming Chang, Markham (CA)

(73) Assignee: King Tiger Technology (Canada) Inc., Markham (CA)

(*) Notice: Subject to any disclaimer, the term of this patent is extended or adjusted under 35 U.S.C. 154(b) by 8 days.

(21) Appl. No.: 16/633,408

(22) PCT Filed: Jul. 25, 2018

(86) PCT No.: PCT/CA2018/050895
§ 371 (c)(1),
(2) Date: Jan. 23, 2020

(87) PCT Pub. No.: WO2019/018929
PCT Pub. Date: Jan. 31, 2019

(65) Prior Publication Data
US 2020/0379033 A1      Dec. 3, 2020

Related U.S. Application Data

(60) Provisional application No. 62/536,692, filed on Jul. 25, 2017.

(51) Int. Cl.
*G01R 31/28* (2006.01)
(52) U.S. Cl.
CPC ..... *G01R 31/2868* (2013.01); *G01R 31/2863* (2013.01); *G01R 31/2875* (2013.01);
(Continued)

(58) Field of Classification Search
CPC ............ G01R 31/2893; G01R 31/2863; G01R 31/2806; G01R 31/2868; G01R 31/2867;
(Continued)

(56) References Cited

U.S. PATENT DOCUMENTS

| 5,093,982 A | * | 3/1992 | Gussman | ........... G01R 31/2867 29/244 |
| 5,650,732 A | * | 7/1997 | Sakai | ................. G01R 1/06705 324/757.04 |

(Continued)

FOREIGN PATENT DOCUMENTS

TW          201917397 A       5/2019

OTHER PUBLICATIONS

Rouse, "burn-in: What is burn-in?", definition from WhatIs.com, Oct. 2008, TechTarget, <https://whatis.techtarget.com/definition/burn-in> (1 page).

(Continued)

*Primary Examiner* — Vinh P Nguyen
(74) *Attorney, Agent, or Firm* — Bereskin & Parr LLP/S.E.N.C.R.L., s.r.l.; Tony Orsi; Ahmed Elmallah

(57) ABSTRACT

Various embodiments are described herein for a testing system for performing burn-in testing of electronic devices under a test temperature range using at least one test chamber and a tester. The at least one test chamber is doorless and has a frame defining a chamber opening for receiving at least one burn-in board containing the electronic devices. The tester includes a main frame, a plurality of carrier magazines mounted to the main frame and containing the at least one burn-in board containing the electronic devices, a door panel at a front end of the tester to allow for access into the tester; and a wall panel disposed on a surface opposite the door panel. The wall panel is placed adjacent and secured to the chamber opening of the at least one test (Continued)

chamber to provide an air and temperature seal during testing.

22 Claims, 8 Drawing Sheets

(52) U.S. Cl.
CPC ..... *G01R 31/2877* (2013.01); *G01R 31/2879* (2013.01); *G01R 31/2893* (2013.01)

(58) Field of Classification Search
CPC ............ G01R 31/2862; G01R 31/2872; G01R 31/2886; G01R 31/2884; G01R 31/2874; G01R 31/31905; G01R 31/2875; G01R 31/2877; G01R 31/2879; H01L 21/67098
See application file for complete search history.

(56) References Cited

U.S. PATENT DOCUMENTS

| | | | | |
|---|---|---|---|---|
| 5,894,657 A * | 4/1999 | Kanayama | ......... | H05K 13/0411 29/740 |
| 5,940,303 A * | 8/1999 | Sakai | ................ | H01L 21/67727 324/750.05 |
| 6,218,852 B1 | 4/2001 | Smith et al. | | |
| 6,305,076 B1 * | 10/2001 | Bright | ................ | H05K 13/0482 29/739 |
| 7,292,023 B2 * | 11/2007 | Dangelo | ............ | G01R 31/2863 324/750.05 |
| 7,339,387 B2 * | 3/2008 | Dangelo | ............ | G01R 31/2863 324/750.05 |
| 7,345,495 B2 * | 3/2008 | Dangelo | ............ | G01R 31/2863 324/750.06 |
| 8,456,123 B2 | 6/2013 | Nishiuchi et al. | | |
| 2002/0070745 A1 | 6/2002 | Johnson et al. | | |

OTHER PUBLICATIONS

Anysilicon, "What is a Burn-in Board?", web page, Apr. 29, 2013 <http://anysilicon.com/what-is-a-burn-in-board> (1 page).
EDN, "Burn-in 101", online article, Oct. 14, 2014, AspenCore, Inc. <https://www.edn.com/burn-in-101> (4 pages).
"Burn-in oven", Wikipedia article, Jun. 21, 2017, Wikimedia Foundation, Inc. <https://en.wikipedia.org/wiki/Burn-in_oven> (1 page).
"Burn-in", Wikipedia article, Jun. 21, 2017, Wikimedia Foundation, Inc. <https://en.wikipedia.org/wiki/Burn-in> (2 pages).
Integrated Service Technology Inc., IC Reliability Qualification Board Assembly (Burn in Board), webpage accessed Jul. 24, 2017 (1 page).
TWI LTD., "What is burn-in testing related to electronics devices?", FAQ, webpage accessed on Jul. 24, 2017 <https://www.twi-global.com/technical-knowledge/faqs/faq-what-is-burn-in-testing-related-to-electronics-devices> (1 page).
International Search Report and Written Opinion dated Oct. 1, 2018 in corresponding International Patent Application No. PCT/CA2018/050895 (12 pages).

\* cited by examiner

SYSTEM AND METHOD OF AUTOMATED BURN-IN TESTING ON INTEGRATED CIRCUIT DEVICES

CROSS-REFERENCE

This application is a 35 USC § 371 national stage entry of International Patent Application No. PCT/CA2018/050895, filed Jul. 25, 2018, which claims the benefit of U.S. Provisional Patent Application No. 62/536,692, filed Jul. 25, 2017, and entitled "SYSTEM AND METHOD OF AUTOMATED BURN-IN TESTING ON INTEGRATED CIRCUIT DEVICES"; the entire contents of each of which are hereby incorporated by reference.

FIELD

Various embodiments are described herein that generally relate to systems, devices and methods for performing burn-in testing of electronic devices.

BACKGROUND

Burn-in testing comprises testing an electronic device such as, but not limited to, an Integrated circuit, a computer chip, a memory chip or a system on a chip, for example, for an extended period of time under various conditions to determine if there are any problems with the electronic device before it is used in the field. In other words, the electronic devices can be stress tested to detect early failures thereby increasing the reliability of the electronic devices that are tested. After stress testing the devices are screened to determine if they passed the stress tests.

To aid in performing burn-in testing, a burn-in board may be used which is a circuit board that has electrical sockets for receiving the electronic devices to be tested (also referred to as Devices Under Test (DUT)). The electrical sockets of the burn-in board provide power to the DUTs and may also provide certain electrical test signals to the DUTs depending on the type of burn-in testing that is being performed. The burn-in board is made of materials that can withstand the various test conditions and is made of components that are very reliable and should not fail before the DUT fails.

The burn-in testing can be done for various time periods including many consecutive hours or days, such as from 24 to 168 hours, for example. The various conditions for burn-in testing can include varying the temperature in certain hot or cold temperature ranges, such as up to 125° C., for example, varying other environmental factors such as humidity and also varying the amount of voltage and/or current that is provided to the DUTs.

SUMMARY OF VARIOUS EMBODIMENTS

In a broad aspect, at least one embodiment described herein provides a testing system for performing burn-in testing of electronic devices, wherein the system comprises: at least one test chamber for testing the electronic devices under a test temperature range to obtain test results, the at least one test chamber being doorless and having a frame defining a chamber opening for receiving at least one burn-in board containing the electronic devices; and a tester including: a main frame; a plurality of carrier magazines mounted to the main frame and containing at least one burn-in board containing the electronic devices; a door panel at a front end of the tester to allow for access into the tester; and a wall panel disposed on a surface opposite the door panel, wherein the wall panel and the main frame are releasably securably placed adjacent to the chamber opening of the at least one test chamber when the tester is loaded into the at least one test chamber to provide a jointless door for the at least one test chamber with an air and temperature seal during testing.

In at least one embodiment, the tester comprises a door panel has a power connection for connecting to the burn-in board for providing power to the electronic devices.

In at least one embodiment, connections to the electronic devices for providing power, test signals and recording test results are included in the tester and are separate from the at least one test chamber.

In at least one embodiment, the tester further comprises a test controller that generates command signals and analyzes test results; N test cards that are networked with the test controller; N multi-source power modules; and N transfer boards to test N BIBs.

In at least one embodiment, the tester comprises external test equipment for testing the burn-in board via an external connection during standalone testing or during temperature testing when the tester is loaded into the at least one test chamber.

In at least one embodiment, the external test equipment comprises a rack of test cards that interfaces with a rack of burn-in boards contained within the tester, the burn-in boards having individual connectors for receiving test signals.

In at least one embodiment, the external test equipment is enclosed within a chassis for access and protection.

In at least one embodiment, the wall panel comprises a layer of insulation that is adjacent to the chamber opening when the wall panel is secured during testing.

In at least one embodiment, the testing can be performed by the tester at room temperature without inserting the carrier magazines of the tester into the at least one test chamber.

In at least one embodiment, the testing system further comprises a pre-tester for performing pre-testing on the electronic devices to check if the electronic devices are in a working condition before further testing in the at least one test chamber.

In at least one embodiment, the pre-tester is configured to perform at least one of checking when the electronic devices are properly inserted into sockets of the at least one burn-in board for testing, performing initial testing to make sure the electronic devices are not defective, performing testing for open shorts, and performing functional testing.

In at least one embodiment, the testing system further comprises a loader for loading the electronic devices into the sockets of the at least one burn-in board prior to performing the pre-testing.

In at least one embodiment, the loader comprises a pick and place mechanism that is configured to automatically replace an electronic device that fails the pre-testing with another electronic device.

In at least one embodiment, when testing at one of the sockets fails pretesting for N consecutive tests the socket is considered defective and is masked off from further testing.

In such embodiments, the failed socket is masked off from a functioning socket list that is stored in memory of the burn-in board and/or a data store coupled with the central control server.

In at least one embodiment, the testing system further comprises: a central control server for sending command signals and automating the operation of the testing system; a tester transporter for transporting the tester, the tester transporter including a movement mechanism for moving the tester transporter among various components of the testing system; and a sorter for receiving and sorting the tested electronic devices based on the test results.

In at least one embodiment, power is provided continuously to the tester after the tester has started testing, the tester being provided by power from the tester transporter or a test component that the tester has docked with.

In at least one embodiment, the at least one test chamber comprises a hot chamber and the test temperature range is a hot temperature range.

In at least one embodiment, the at least one test chamber comprises a cold chamber and the test temperature range is a cold temperature range.

In at least one embodiment, the at least one test chamber comprises a room temperature test chamber and the test temperature range is room temperature.

In at least one embodiment, the sorter comprises an intelligent pick and place mechanism that is configured to identify several of the tested electronic devices with test results in a common test result category, pick up the identified electronic devices at the same time and place the picked-up electronic devices into a sorting bin that is associated with the common test result category.

In at least one embodiment, the central control server communicates wirelessly with different components of the testing system.

In another broad aspect, at least one embodiment described herein provides a loader for a testing system for burn-in testing of electronic devices, wherein the loader comprises: a pick and place mechanism for loading electronic devices into sockets of a burn-in board; and a pre-tester for performing pre-testing on the electronic devices to check if the electronic devices are in a working condition for further testing.

The loader is further defined in accordance with at least one aspect of any of the loader embodiments described herein.

In another broad aspect, at least one embodiment described herein provides a tester for use with a test system for testing electronic devices, wherein the tester comprises at least one burn-in board for receiving electronic devices and the tester is further defined according at least one aspect of any of the tester embodiments described herein.

In another broad aspect, at least one embodiment described herein provides a sorter for a testing system for burn-in testing of electronic devices, wherein the sorter is configured to receive tested electronic devices and sorting each tested electronic device based on test results for the electronic devices, the sorter is further defined in accordance with at least one aspect of any of the sorter embodiments described herein.

In another broad aspect, at least one embodiment described herein provides a testing system for performing burn-in testing of electronic devices, wherein the system comprises: a central control server for sending command signals and automating the operation of the testing system; a loader for loading the electronic devices into sockets of a burn-in board and performing pre-testing on the electronic devices to check when the electronic devices are in a working condition for further testing; a tester transporter comprising: a tester for receiving the burn-in board with the pre-tested electronic devices; and a movement mechanism for moving the tester transporter among various components of the testing system; at least one test chamber for receiving the burn-in board and testing the electronic devices under a test temperature range to obtain test results; and a sorter for receiving and sorting the tested electronic devices based on the test results, wherein the tester provides a door for the at least one test chamber during testing.

Other features and advantages of the present application will become apparent from the following detailed description taken together with the accompanying drawings. It should be understood, however, that the detailed description and the specific examples, while indicating one or more embodiments of the application, are given by way of illustration only, since various changes and modifications within the spirit and scope of the application will become apparent to those skilled in the art from this detailed description.

BRIEF DESCRIPTION OF THE DRAWINGS

For a better understanding of the various embodiments described herein, and to show more clearly how these various embodiments may be carried into effect, reference will be made, by way of example, to the accompanying drawings which show at least one example embodiment, and which are now described. The drawings are not intended to limit the scope of the teachings described herein.

Figure 1:
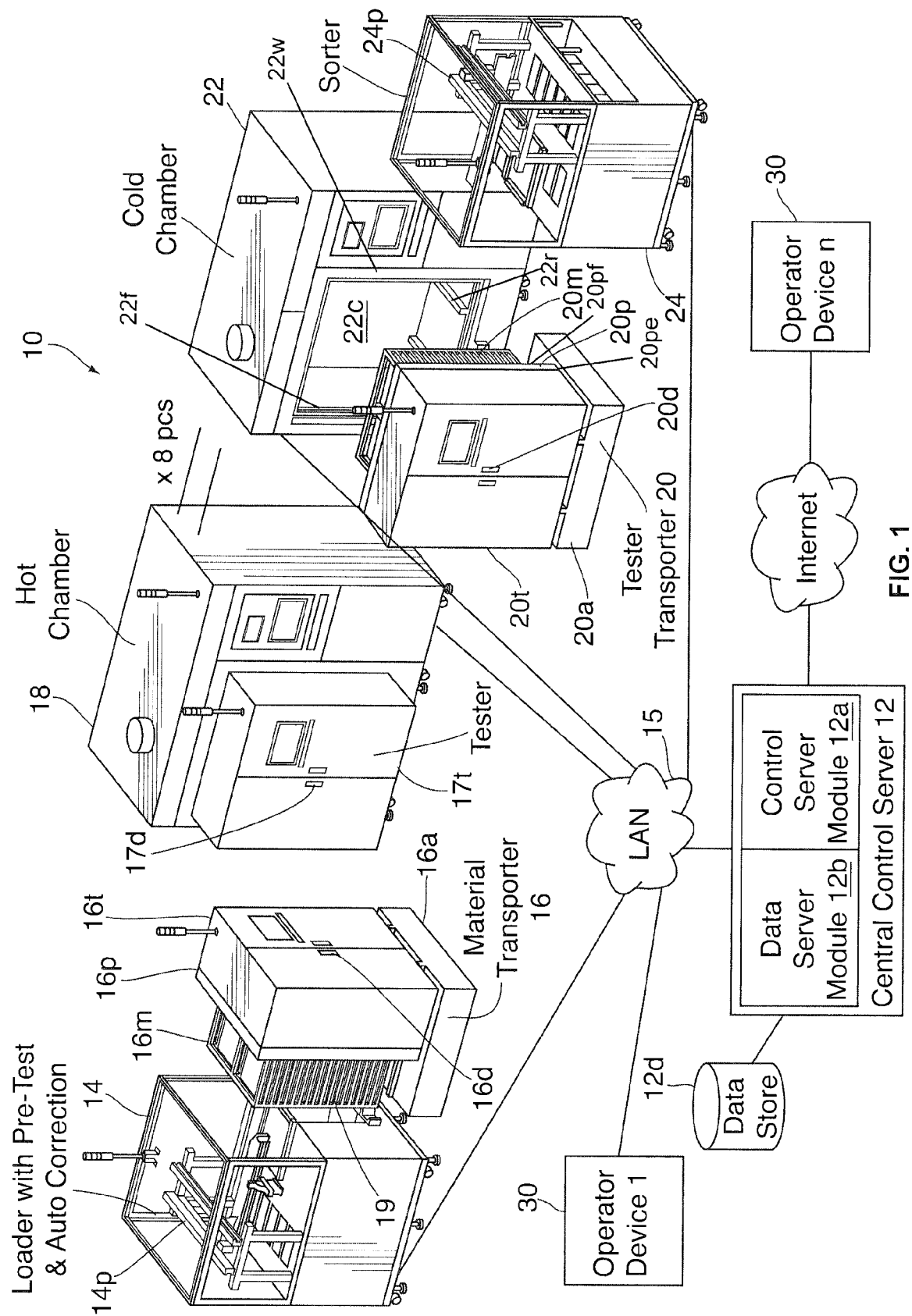
FIG. 1 is a block diagram of an example embodiment of a testing system in accordance with the teachings herein.

Further aspects and features of the example embodiments described herein will appear from the following description taken together with the accompanying drawings.

DETAILED DESCRIPTION OF THE EMBODIMENTS

Various systems, devices or methods will be described below to provide an example of at least one embodiment of the claimed subject matter. No embodiment described herein limits any claimed subject matter and any claimed subject matter may cover systems, devices or methods that differ from those described herein. The claimed subject matter is not limited to systems, devices or methods having all of the features of any one system, process or device described below or to features common to multiple or all of the systems, devices or methods described herein. It is possible that a system, device or method described herein is not an embodiment of any claimed subject matter. Any subject matter that is disclosed in a system, device or method described herein that is not claimed in this document may be the subject matter of another protective instrument, for example, a continuing patent application, and the applicants, inventors or owners do not intend to abandon, disclaim or dedicate to the public any such subject matter by its disclosure in this document.

Furthermore, it will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

It should also be noted that the terms "coupled" or "coupling" as used herein can have several different meanings depending in the context in which these terms are used. For example, the terms coupled or coupling can have a mechanical, electrical or communicative connotation. For example, as used herein, the terms coupled or coupling can indicate that two or more elements or devices can be directly connected to one another or connected to one another through one or more intermediate elements or devices via an electrical element, electrical signal or a mechanical element depending on the particular context. Furthermore, the term "communicative coupling" indicates that an element or device can electrically, or wirelessly send data to or receive data from another element or device depending on the particular embodiment.

It should also be noted that, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

It should also be noted that terms of degree such as "substantially", "about" and "approximately" as used herein mean a reasonable amount of deviation of the modified term such that the end result is not significantly changed. These terms of degree may also be construed as including a deviation of the modified term, such as but not limited to 1%, 2%, 5% or 10%, if this deviation would not negate the meaning of the term it modifies.

Furthermore, the recitation of numerical ranges by endpoints herein includes all numbers and fractions subsumed within that range (e.g., 1 to 5 includes 1, 1.5, 2, 2.75, 3, 3.90, 4, and 5). It is also to be understood that all numbers and fractions thereof are presumed to be modified by the term "about", which means a variation of up to a certain amount of the number to which reference is being made if the end result is not significantly changed, such as but not limited to 1%, 2%, 5% or 10%, for example.

The example embodiments of the systems, devices or methods described in accordance with the teachings herein are implemented as a combination of hardware and software. For example, the embodiments described herein may be implemented, at least in part, by using one or more computer programs, executing on one or more programmable devices comprising at least one processing element, and at least one data storage element (including volatile and non-volatile memory). It should also be noted that there may be some elements that are used to implement at least part of the embodiments described herein that may be implemented via software that is written in a high-level procedural language such as object oriented programming. The program code may be written in C, C++ or any other suitable programming language and may comprise modules or classes, as is known to those skilled in object oriented programming. Alternatively, or in addition thereto, some of these elements implemented via software may be written in assembly language, machine language or firmware as needed.

At least some of these software programs may be stored on a storage media (e.g., a computer readable medium such as, but not limited to, ROM, magnetic disk, optical disc) or a device that is readable by a general or special purpose programmable device. The software program code, when read by the programmable device, configures the programmable device to operate in a new, specific and predefined manner in order to perform at least one of the methods described herein.

Furthermore, at least some of the programs associated with the systems and methods of the embodiments described herein may be capable of being distributed in a computer program product comprising a computer readable medium that bears computer usable instructions, such as program code, for one or more processors. The program code may be preinstalled and embedded during manufacture and/or may be later installed as an update for an already deployed computing system. The medium may be provided in various forms, including non-transitory forms such as, but not limited to, at least one of diskettes, compact disks, tapes, chips, and magnetic and electronic storage. In alternative embodiments, the medium may be transitory in nature such as, but not limited to, wire-line transmissions, satellite transmissions, internet transmissions (e.g. downloads), media, digital and analog signals, and the like. The computer useable instructions may also be in various formats, including compiled and non-compiled code.

In accordance with the teachings herein there is provided a testing system for testing integrated circuits, computer chips and memory chips such as, but not limited to, DRAM, SRAM and FLASH memory. In an example embodiment, the testing system is implemented as an un-manned DRAM testing facility that is operated via central control by using a programmed processing command sequence with built-in intellect for smart operation. For example, in at least some embodiments, the testing system can operate without the need for a single operator to perform any production operations other than maintenance and service.

Figure 2A:
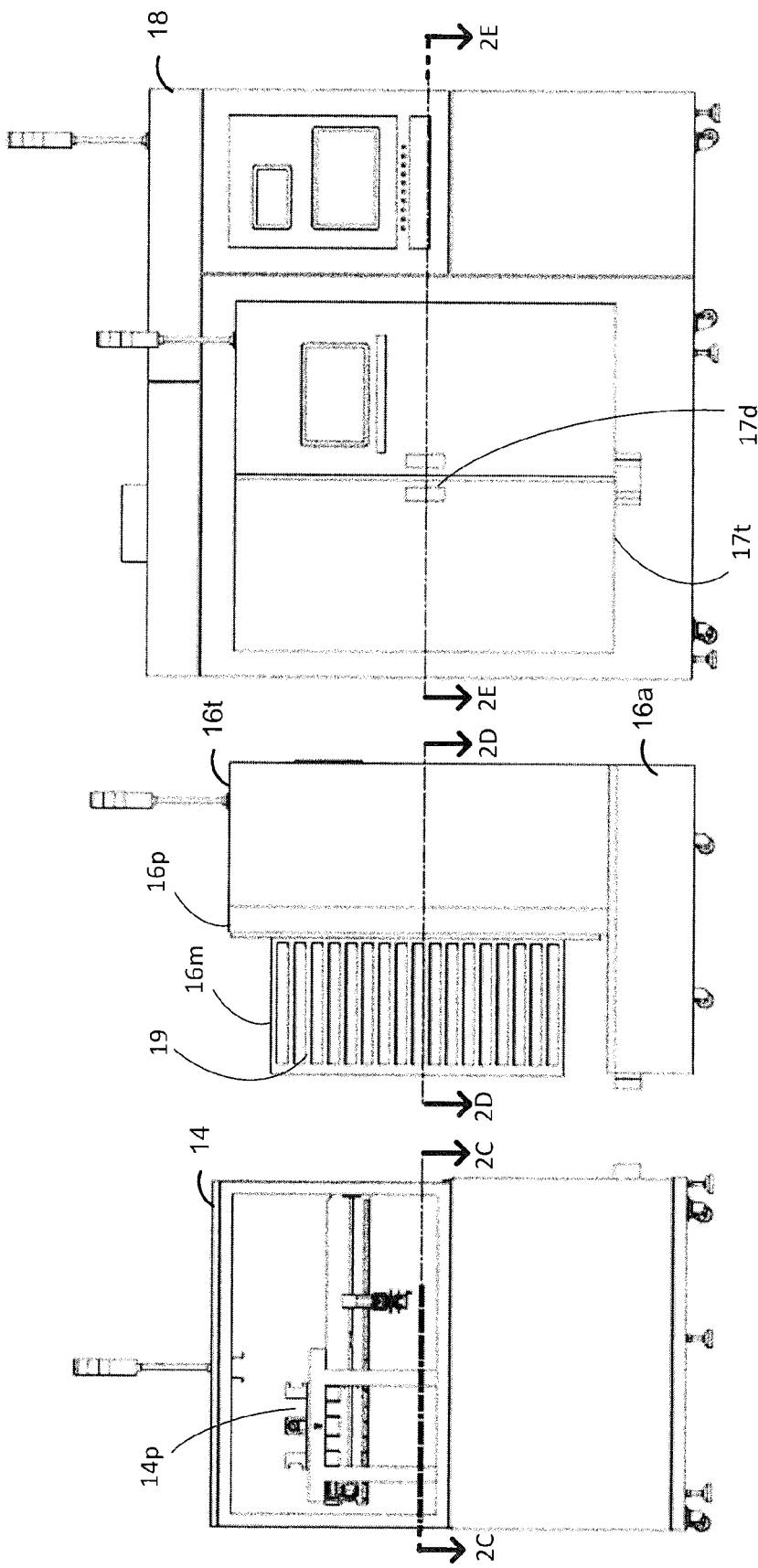
FIG. 2A is a front view of a loader, a first transporter and hot chamber with a docked tester of the testing system of FIG. 1.
Figure 2B:
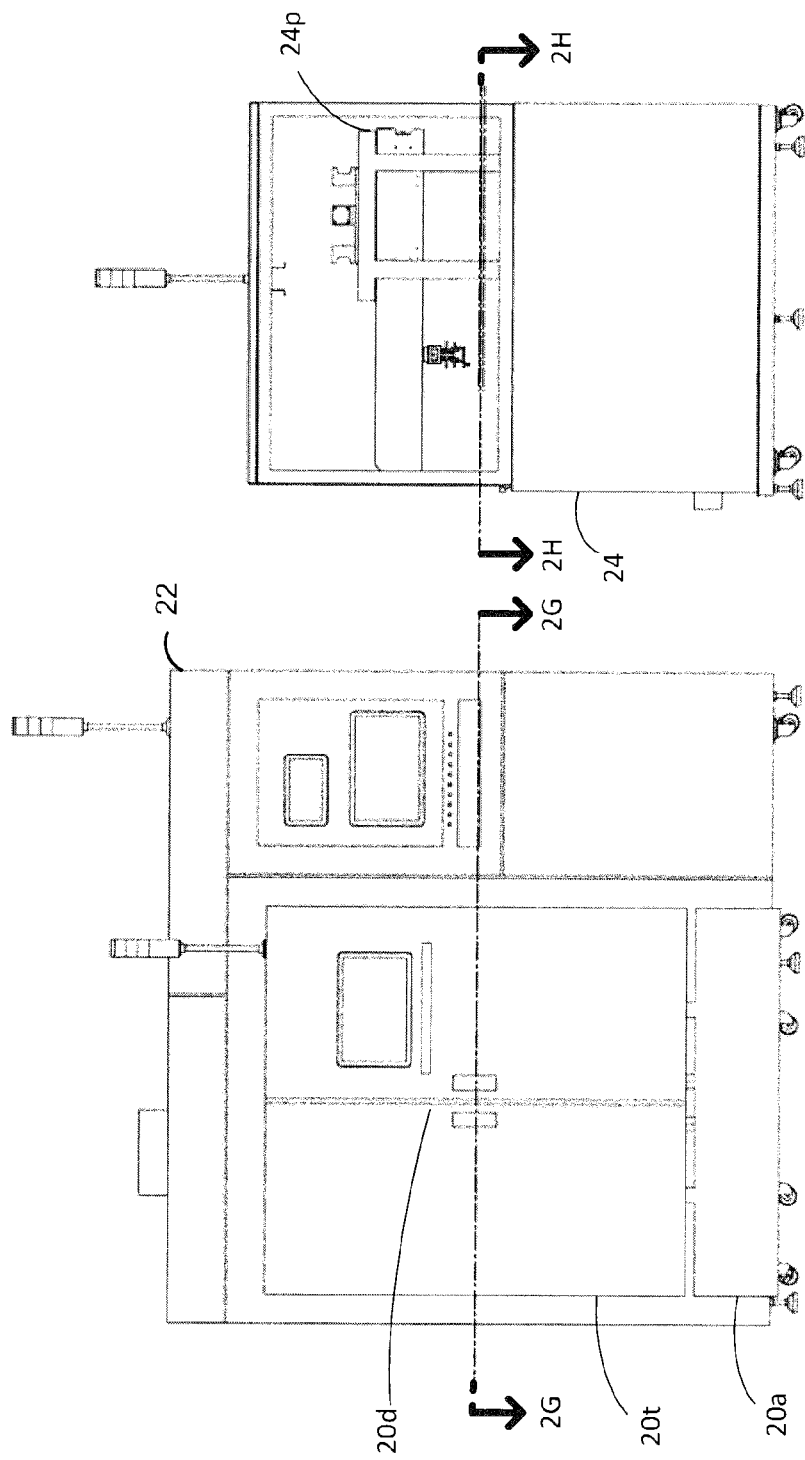
FIG. 2B is a front view of a cold chamber, a second transporter and a sorter of the testing system of FIG. 1.
Figure 2D:
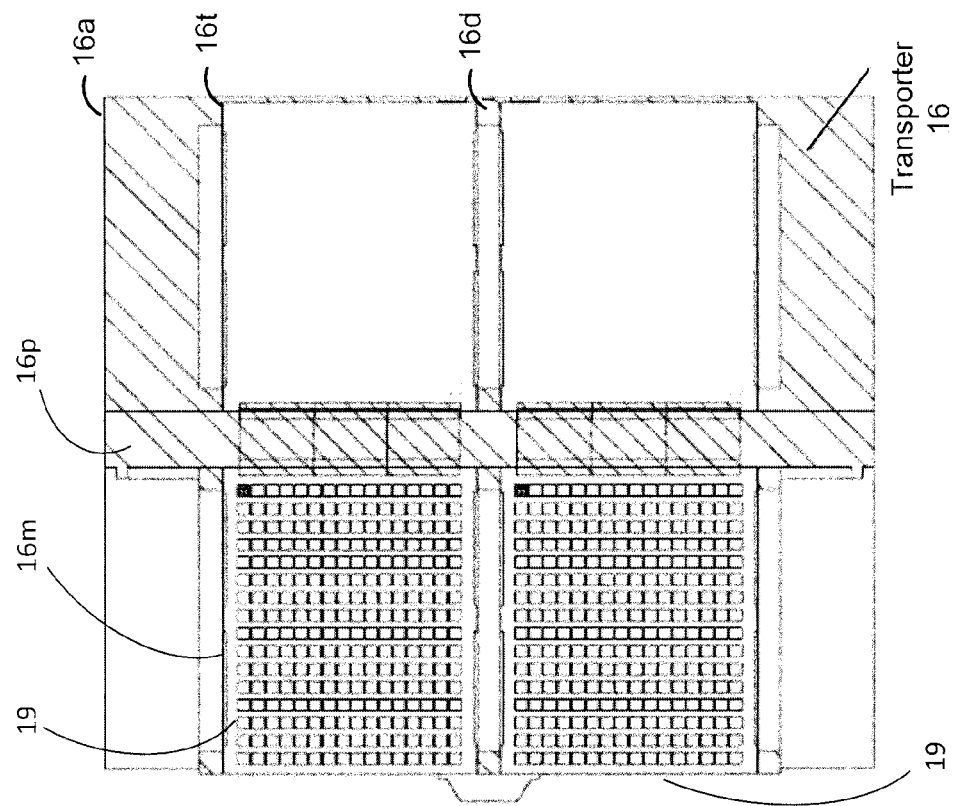
FIGS. 2C-2D are cross-sectional top views of the loader and first transporter of the testing system of FIG. 1.
Figure 2C:
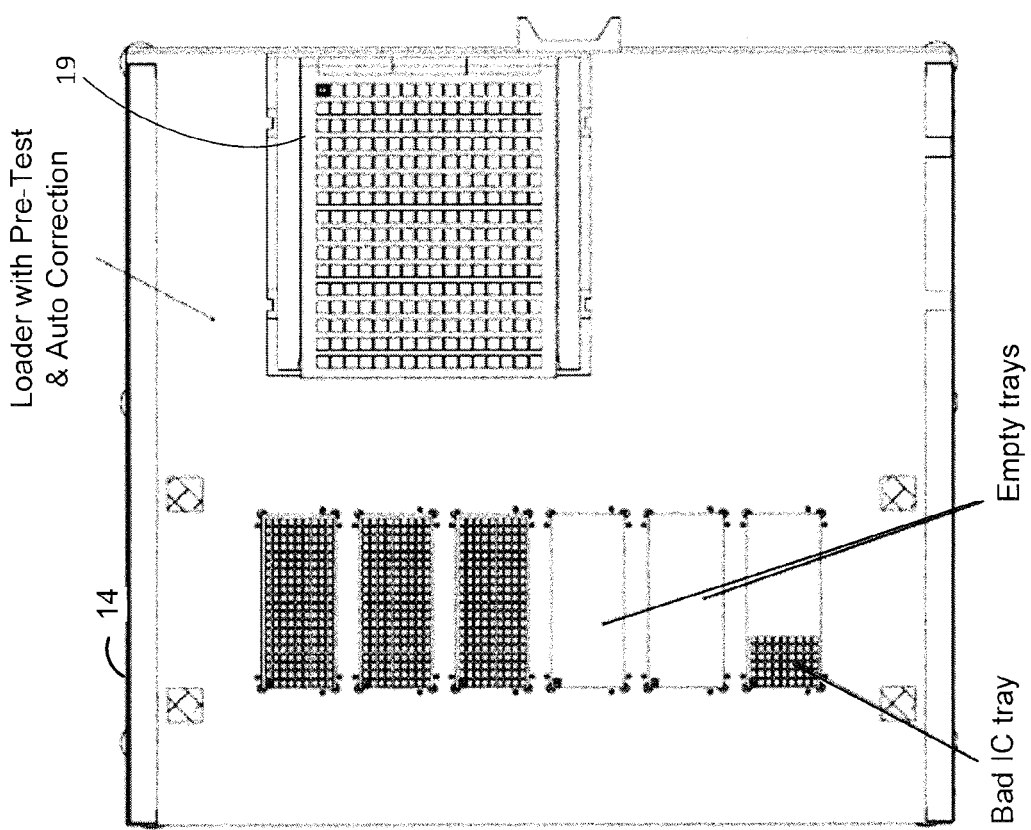
Figure 2E:
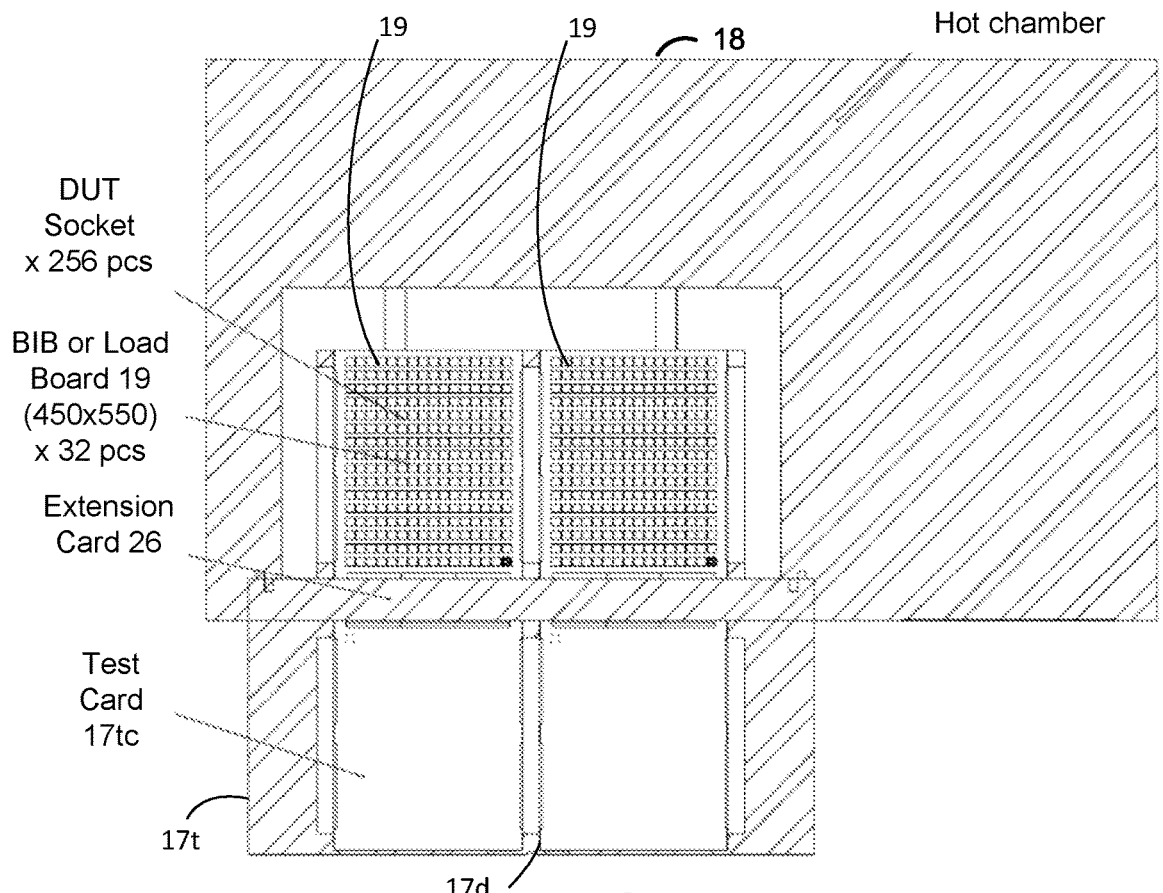
FIGS. 2E-2F are cross-sectional top views of the hot chamber, docked tester and cold chamber of the testing system of FIG. 1.
Figure 2F:
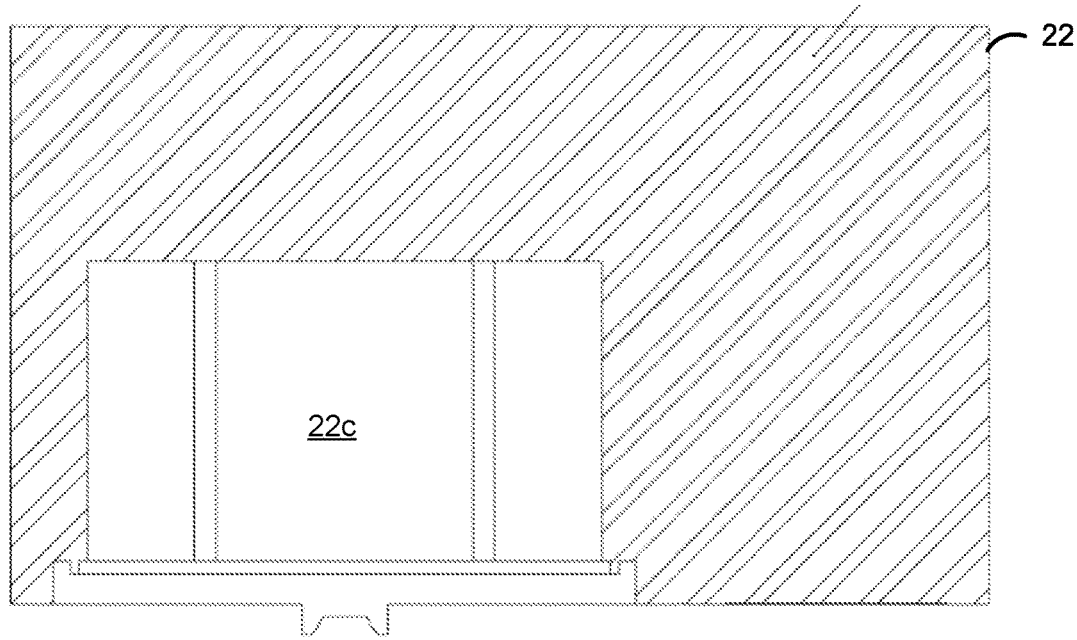
Figure 2H:
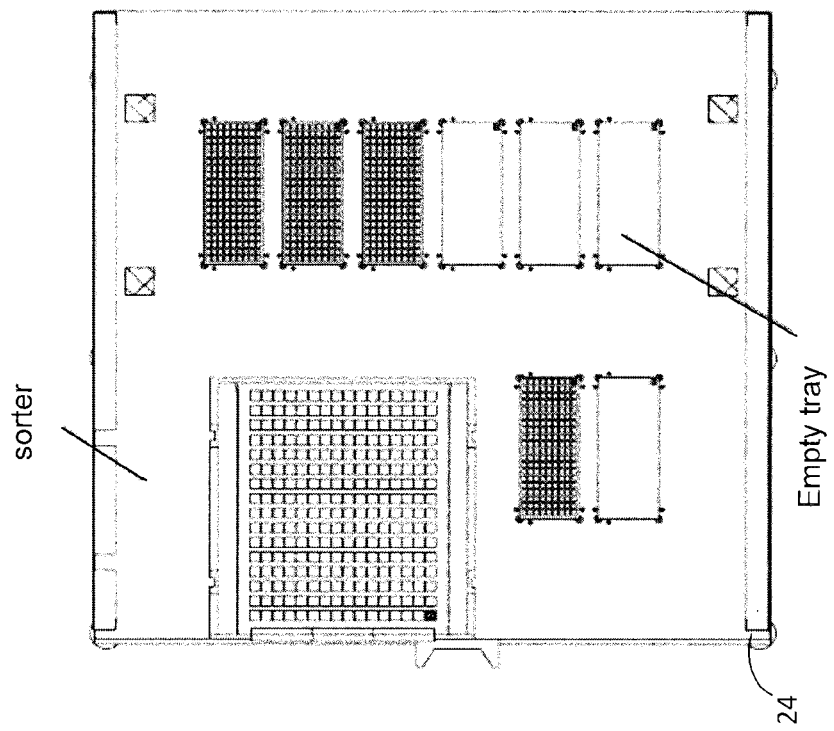
FIGS. 2G-2H are cross-sectional top views of the second transporter and sorter of the testing system of FIG. 1.
Figure 2G:
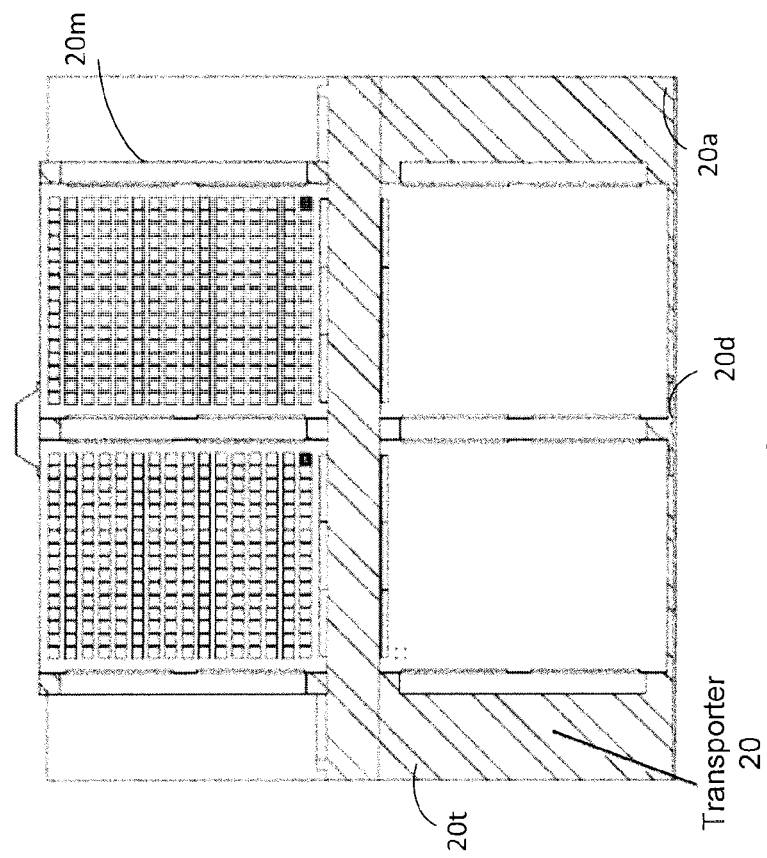

Referring now to FIGS. 1 to 2H, shown therein are various views of an example embodiment of the testing system 10 and its components. The testing system 10 comprises a central control server 12, a loader 14 (including a loading mechanism and a pre-tester), a material transporter 16 (i.e. a material Auto Guided Vehicle (AGV)), a hot chamber 18 (i.e. an oven), a cold chamber 22, a tester transporter 20 (i.e. a tester AGV) and a sorter 24. The testing system 10 further comprises burn-in boards (BIBs) 19 that are used with the hot chamber 18 and the cold chamber 20 and carrier magazines 16m, 17m and 20m that are used to hold several trays where each tray includes a plurality of DUTs. Only one of the BIBs 19 is labelled for ease of illustration. It should be noted that there can be multiple instances of these components in some embodiments. For example, there may be more than one hot chamber 18, more than one cold chamber 22, and/or more than two transporters.

The testing system 10 and each of the components 12, 14, 16, 18, 20, 22 and 24 are wirelessly networked using wireless signals in accordance with a wireless communication network such as a secured Wi-Fi network, e.g. a secured wireless LAN 15. Some of the elements can also communicate with one another such as the tester 17t communicating with the hot chamber 18 and/or the cold chamber 22. The transporters 16 and 20 are mobilized which means that they have moving parts and some of the components (i.e. transporters 16 and 20) may be able to physically move between two locations.

The central control server 12 (i.e. control server) controls the operation of the testing system 10. The central control server 12 can be any suitable processor, controller or digital signal processor that can provide sufficient processing power depending on the configuration and operational requirements of the central control server 12 and also contains sufficient memory, such as data store 12*d*, for storing data and databases. For example, the central control server 12 may be a high performance general processor. In alternative embodiments, the central control server 12 may include more than one processor with each processor being configured to perform different dedicated tasks.

The central control server 12 can be considered as having two components: a control server module 12*a* and a data server module 12*b*. The control server 12*a* communicates with the field units (i.e. the other components of the testing system 10) via wireless communication (e.g. secured wireless LAN 15), issues commands and collects data. The data server module 12*b* is coupled with the data store 12*d* for storing large amounts of data, including test results based on Birth ID and serial number (i.e. BID) of each DUT. The data server module 12*b* is used to keep track of test plans and the conditions of each system component for maintenance purposes.

Operators can use operator devices 30 for monitoring and/or operating the various components of the testing system 10. For example, an operator device 1 can be wirelessly coupled to the central control server 12 through the LAN 15. Alternatively, operator device n can be coupled to the central control server 12 through the Internet or another suitable network. An operator using the operator device n can therefore remotely monitor and control the testing system 10.

The loader 14 includes a loading mechanism 14*p* and a pre-tester that performs pre-testing and auto correction. The function of the loading mechanism 14*p* of the loader 14 is to insert un-tested DUTs from standard carrier trays, such as JEDEC standard carrier trays for example, to DUT sockets of the BIB 19. The function of the pre-tester is to perform initial testing on the DUTs.

The un-tested devices are contained within a carrier tray which are manually pre-loaded into a carrier magazine 16*m* in a packing house or in a warehouse for easy and safe handling. These carrier magazines 16*m* may be manually loaded into a tester 16*t* which can then be moved to different elements of the testing system 10 by a transporter, such as the material AGV 16. The carrier magazine 16*m* is an internally adjustable rack that can carry a plurality of standard device carrier trays such as up to 50 pieces of JEDEC standard device carrier trays, for example. The carrier magazines 16*m* provide protection during transportation, minimize handling error, and enable ease of automation. Once the DUTs are loaded into the carrier magazines 16*m*, the testing process may be automated. Advantageously, in accordance with the teachings herein, when the DUTs are in the carrier magazines 16*m*, all of the DUTs can be inserted into the test chamber when the carrier magazines 16*m* of a tester are inserted into the test chamber. Therefore, the connections (i.e., provided by the connectors 410 in FIG. 4) to the DUTs for providing power, test signals and recording test results are included in the tester and are separate from the test chamber. This shortens the loading time compared to conventional testing systems in which the DUTs are inserted one at a time into the BIBs that are located within the test chamber The loading mechanism 14*p* of the loader 14 can be a pick and place mechanism to pick up DUTs from a carrier tray of the carrier magazine 16*m* and place them into DUT sockets of the BIB 19. After the DUTs are placed in the DUT sockets of the BIB 19, the loader 14 provides power to the BIB 19 to run initial pre-testing on the DUTs. A pre-tester is built-in to the loader 14 and is configured to perform initial pre-testing which comprises checking if the DUTs were properly inserted into corresponding DUT sockets of the BIB 19. In addition, the pre-tester performs a quick initial test to make sure the DUTs are not defective, and to make sure that they are in a sufficient working condition and can be subjected to further testing. The criteria for determining a sufficient working condition is known by those skilled in the art. The initial pre-testing may include testing for open shorts, and some quick functional testing, for example. If any DUTs fail at this stage, they will be automatically replaced with another DUT by the pick and place mechanism 14*p*. Failed DUTs can be stored in a rejected tray that is kept within the magazine 16*m*. If the initial testing at a given DUT socket fails several times consecutively such as three times consecutively, for example, the DUT socket is considered as being a defective DUT socket. A defective DUT socket will be masked off from a functioning DUT socket list (also known as a pick and place location list) so that it is not used for any future testing. The functioning socket list information can be stored in a memory device on the BIB 19, as well as a central database in the data store 12*d*, so that a list of failed DUT sockets can be viewed and considered for maintenance at a later time. This process is repeated for all of the BIBs in the carrier magazine 16*m*.

The BIB (Burn-In Board) 19 is a load board that contains a plurality of DUT sockets such as 256 DUT sockets, for example. The DUT sockets are high-temperature range sockets, and have a locking mechanism to hold the DUT in place during the testing. The operating range of the BIB 19 can be from about −40 degrees Celsius to about +150 degrees Celsius. The BIB 19 is further re-enforced with a frame and a protection plate. To make sure that the protection plate will not reduce air circulation, multiple openings on the protection plate may be incorporated.

The size of the BIB 19 can be based on the most economical industry size. Due to the size of the BIB 19 and the length of the signal traces, an arrangement can be determined based on signal simulation that can be done to determine the arrangement that reduces cross-talk, reduces reflections of the signals and provides impedance matching and impedance control. In addition, the BIB 19 contains a temperature sensor to measure the actual temperature on the BIB 19, which can then be provided as feedback to create closed control loop and monitoring functions.

Each BIB 19 also contains a memory unit, such as FLASH memory, for example. The BIB memory unit can be used to record the test result of each DUT on the BIB 19, as well as various information about the BIB 19 such as, but not limited to, the ID of the BIB 19, the DUT socket conditions, and the like, for example. With the DUT socket condition information, a defective DUT socket can be disabled, which therefore eliminates any unnecessary DUT re-insertion time.

After loading and pre-testing, the DUTs in the carrier magazine are placed within a tester that is moved by the tester transporter 20 (i.e. the tester AGV). The tester transporter 20 has a movement mechanism 20*a* for moving a tester 20*t* to different locations, a power supply (i.e. battery)

for providing power to the tester 20t, and a power connector for connecting to the power sources of other devices and receiving power. The tester 20t performs (1) self-testing of the DUTs and (2) self-repairing of DUTs that fail testing. The tester 20t can operate as the tester transporter 20 is moving since the tester transporter 20 provides power to the tester 20t. Once the BIBs are loaded with DUTs and placed within the tester 20t, power and electrical test signals are supplied to the BIBs so that testing can be performed.

The tester 20t may be operated at a 200 MHz speed. High-speed electrical test signals are generated by a test card through a transfer board to the BIB 19 that is being tested. The transfer board is shown as the extension card 26 in FIG. 2E. The transfer board 26 is in between the BIB 19 and the test card 17tc, and it is set in the wall of the BIB rack and the tester 20t. The transfer board 26 is used to send signals from the BIB 19 to the test card. It should be noted that the BIB 19 is in a controlled environment, the test card 17tc is disposed outside of the test chamber and is at room temperature, and there is a thick insulated wall 20p in between the test card and the test chamber. The transfer board 26 is set in the thick insulated wall 20p.

An example of a test card is test card 17tc shown in FIG. 2E. The test card is the engine of the tester 20t. The test card 17tc is configured to generate control signals (such as DRAM control signals when testing DRAM chips), generate test patterns, generate test algorithms, and the like. The test card 17tc is also configured to control test timing and test voltage, monitor current during testing, monitor insertion of the DUTs in the DUT test sockets, and record the test results. The test patterns, test algorithms, and test control programs can be customized using a suitable programming language such as a pattern programming language (PPG) such as KingTiger's PPG or Advantest's PPG.

Using tester 16t for illustration purposes, in this example embodiment, each tester generally includes a base, a plurality of carrier magazines 16m, a main frame (i.e. chassis), a door panel 16d, and an insulated wall 16p. The carrier magazines 16m receive carrier trays containing the DUTs. The door panel 16d is on a front end of the main frame and the insulated wall 16p is on the rear end of the main frame. The carrier magazines 16m extend from the rear end of the main frame. The insulated wall 16p may be a solid or hollow wall, with channels for electrical wiring, and the carrier magazines 16m extend from the insulated wall 16p. Alternatively, the insulated wall 16p may instead be a rectangular frame that surrounds the carrier magazines 16m, which are mounted on an internal frame or rack. The base of the tester 16t can rest upon a transporter such as the material transporter 16 or the tester transporter 20 when it is moved to different stations of the testing system 10. When the tester 16t is moved to one of the hot or cold chambers 18 and 22 for testing, the carrier magazines 16m are inserted into the test chamber and the base of the tester 16t sits on floor of the test chamber. In some cases, the floor of the test chamber may comprise beams or rails 22r upon which the base rests to provide for air circulation underneath the tester 16t during testing.

Figure 4:
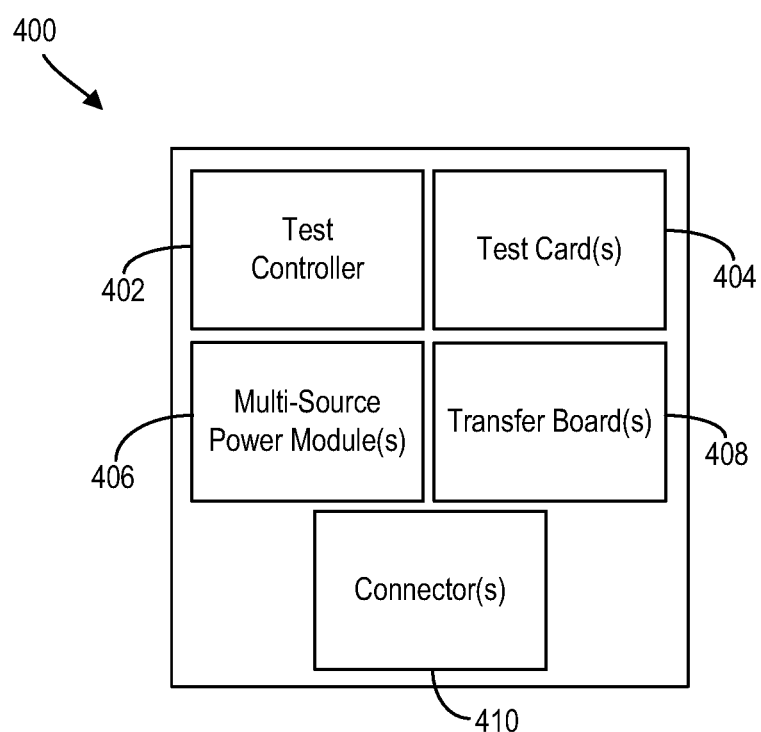
FIG. 4 is a simplified block diagram of an example tester in accordance with the teachings herein.

In this example embodiment, the tester 20t further contains a test controller 402 (tester 400 in FIG. 4), thirty-two test cards 17tc (see also test card(s) 404 in FIG. 4 which are similar to test cards 17tc), thirty-two multi-source power modules 406 (FIGS. 4), and thirty-two transfer boards 26 (see also transfer board(s) 408 in FIG. 4 which are similar to transfer boards 26) to serve thirty-two BIBs 19 and can test the BIBs sequentially or in parallel. In other embodiments, another number (N, wherein N≥1) of test cards, power modules and transfer boards may be used. Each test card is networked internally with the test controller which generates command signals and analyzes test results. The test controller can also provide temporary storage of data and can communicate with the central control server 12. The test results will be collected by the test controller and recorded on the memory unit of the BIB 19 and also stored on the data store 12d by the central data server module 12b. Therefore, in accordance with the teachings herein, there are no connections between the BIBs and the test chamber as all of the required connections needed for providing test signals and power to the BIBs is provided by various components of the tester. This leads to less loading time, better testing reliability, minimizing exposure of the connectors in the test chamber.

Furthermore, during the burn-in testing process, the tester 20t can also perform repairs when it finds that certain DUTs have at least one failed bit that fails at least one test and where there is a redundancy cell that is available for repair. After repair, the tester 20t will repeat the tests until no further failed bits are found or all of the redundancy cells are used.

It is worthwhile to note that power for operating the tester 20t is taken from the power of at least one of the tester transporter 20, the loader 14, the sorter 24, the hot chamber 18 or the cold chamber 22. For example, during transit, power is taken from the tester transporter 20. Once the tester 20t has docked, it will take power from the device that it is docked with.

The tester AGV 20 is an intelligent auto guided vehicle, and can have up to about 1,000 kgs of loading capacity. The tester AGV 20 can have a mapping function and be pre-mapped with a laser guiding system, has built-in intelligence to avoid blockades and can analyze the best route from its current position to a destination. The tester AGV 20 only needs to be commanded with the destination, and there is no need to fix the routes.

The function of the tester AGV 20 is to carry the tester 20t to the sorter 24 or one of the test chambers 18 or 22. Once the tester 20t is docked into one of the test chambers 18 or 22, further testing is carried out in a pre-programmed manner. The tester movement mechanism 20a can then detach from the tester 20t and be dispatched to carry on with the next task. This maximizes the usage of the tester movement mechanism 20a so that it can be used with several different testers, for example.

While the tester 20t is docking to a component (i.e. docked station) of the testing system 10 such as one of the test chambers 18 or 22, the loader 14 or the sorter 24, it can connect to the power module of the station it is docked at to charge its battery. The tester 20t can also be provided with power from the tester transporter 20. For example, the battery of the tester AGV 20 can be used to power the tester 20t while it is in transit. This ensures that the tester 20t is always in a working condition. Accordingly, power is provided continuously to the tester 20t after the tester 20t has started testing.

The hot chamber 18 is a test chamber that is used to test the BIBs in a high temperature operating range that can range from the environment temperature (i.e. the ambient or room temperature) up to about +150 degrees Celsius. The design of the hot chamber 18 (and the cold chamber 22 for that matter) can be simplified. Conventional test chambers have all of the connectors and the testers inside and towards the back of the test chamber and the operator needs to be very precise in inserting the BIBs into the test chamber. The operator also needs to use a large force to plug in all of the BIBs into the corresponding connectors within the test chamber at the same time. When the BIBs are all inserted, the operator then closes and secures the door to the test chamber. After testing, the operator must use a big pulling force to pull out all of the BIBs when they have to be removed from the test chamber.

In contrast, in accordance with the teachings herein, the connectors to the BIB and the test circuits are mounted together at the tester so that these elements are now moved outside of the test chamber (see the description of panel doors further below). The connectors are also configured so that the BIBs can be connected individually rather than as a group (as in conventional test systems). The DUTs can therefore be loaded into the tester and then the portion of the tester containing the DUTs is placed in the chamber and testing can be done. Accordingly, the loading and unloading of the DUTs is easier using the testers described herein.

Heating can be provided by heating elements and forced air fans that circulate the heated air and form an even temperature distribution throughout the hot chamber 18. The regulation of the temperature of the hot chamber 18 can be controlled by a closed-loop temperature controller with multiple temperature sensors in each slot to ensure the evenness of the temperature on each BIB in the hot chamber 18. The slots are formed in the BIB rack. The BIBs are inserted into the slots. A temperature sensor can be mounted on each BIB and thus a temperature reading can be obtained for each slot. To further control the precision of air flow into each slot, an air deflector can be manually pre-adjusted.

Fresh air and hot air will be obtained through an intake valve and ventilated through an exhaust duct to the outside of the testing environment; therefore, the internal air condition within the hot test chamber 18 and the testing environment will not be affected. This is important since manufacturing guidelines require that the testing environment have a certain dust free condition (i.e. the testing environment must achieve a certain degree of being dust free). To achieve this an air conditioning and filtering system may be used. To further minimize effects to the internal air condition of the hot chamber 18, and to protect the inner contents of the test chamber, a temporary removable rolling or sliding door can be used to close the opening of the hot chamber 18 when it is idle and not being used to test DUTs.

In operation, once the tester 20t is docked and inserted into the hot chamber 18, the temperature of the hot chamber 18 is increased in the hot temperature range and various tests are performed on the DUTs in the hot temperature range. After testing in the hot temperature range is completed, the hot chamber 18 will return to room temperature before un-docking of the tester 20t from the hot chamber 18.

In some embodiments, the hot chamber 18 can also be used as a normal temperature operating chamber by turning off the heating elements. This will mimic the actual working environment, where all the heat is generated by the DUTs in an enclosed environment.

The cold chamber 22 has a test chamber 22c that is used to test the BIBs in a low temperature operating range that can range from the environment temperature (i.e. the ambient or room temperature) down to about −40 degrees Celsius. Cooling can be provided by a cooling compressor and forced air fans that circulate the cooled air and form an even temperature distribution throughout the cold chamber 22. The regulation of temperature in the cold chamber 22 can be controlled by a closed-loop temperature controller with multiple temperature sensors in each slot (as explained previously for the hot chamber 18) to ensure the evenness of the temperature on each BIB. To further control the precision of air flow into each slot, an air deflector can be manually pre-adjusted.

Fresh air and cold air can be obtained through an intake valve and ventilated through an exhaust duct to outside of the testing environment; therefore, the internal air condition of the test environment and the cold chamber 22 will not be affected (as explained previously for the hot chamber 18). To further minimize effects to the internal air condition of the cold chamber 22, and to protect the inner contents of the test chamber 22c of the cold chamber, a temporary removable rolling or sliding door can be used to close the opening of the cold chamber 22 when it is idle and not being used for test DUTs.

In operation, once the tester 20t is docked and inserted into the cold chamber 22, the temperature of the cold chamber 22 is decreased in the cold temperature range and various tests are performed on the DUTs in the cold temperature range. After testing in the cold temperature range is completed, the cold chamber 22 will return to room temperature before un-docking of the tester 20t from the cold chamber 22. In order to prevent moisture from being creating during the temperature change from cold temperatures to warmer temperatures, dry air can be sent into the cold chamber 22 to fill the cold chamber 22 before it is returned to room temperature.

In conventional test systems, when the BIB 19 is powered, the power is taken either from the back or the side of inside of the burn-in chamber (i.e. the hot chamber 18 or the cold chamber 22) by a power cable or power connector mounted on the burn-in chamber. However, this has several disadvantages such as: (1) the burn-in chamber has to be idle when the BIB 19 is loaded into the burn-in chamber; (2) the worker who is connecting the power to the BIB 19 will be exposed to (i.e. facing) hot air from the hot chamber 18 or cold air from the cold chamber 22; and (3) the burn-in chamber requires that a door to the opening of the chamber be closed before heat is generated in the case of the hot chamber 18 or before cold air is generated in the case of the cold chamber 22.

Advantageously, in accordance with the teachings herein, instead of connecting power to the BIB 19 from the hot chamber 18 or the cold chamber 22, the power is connected to the BIB 19 from the door panel 20d of the tester 20t when the door panel 20d is opened and away from the test chamber of the hot chamber 18 or the cold chamber 22. This provides several advantages such as: (1) eliminating the need for the worker to face and be exposed to hot air or cold air from the hot chamber 18 or the cold chamber 22, respectively, while loading the BIB 19 and connecting power from the test chamber to the BIB 19; (2) since the connection of power to the BIB is done a safe distance away from the internal test chamber itself, the connection of power to the BIB 19 can be done separately from inserting the BIB 19 into the test chamber, and the test chamber does not need to be idle during this power connection; and (3) since the test chamber door is now provided by the wall panel 20p and certain portions of the chassis of the tester transport 20, and accessed from the outside of the tester 20 by the door panel 20d, it eliminates the need for a complicated door mechanism, e.g. a bi-fold door, and frees up space that is otherwise taken up when a conventional door is opened for conventional hot or cold chambers. The wall panel 20p also provides a layer of insulation.

When the tester 20t along with the wall panel 20p, and the door panel 20d is used as a door for the test chamber, an operator can manually place the wall panel 20p in front of the opening of the test chamber and lock the wall panel 20p to the test chamber. Alternatively, a machine, such as the transporter, can be used to automatically place the wall panel 20p in front of the opening of the test chamber and lock the wall panel 20p to the test chamber. In either case, the wall panel 20p is flush with the chamber opening and releasably fixed in place, and the door panel 20d is also closed to seal the opening of the test chamber. The closing of the door panel 20d to the test chamber and the placement of the wall panel 20p flush with the chamber opening can result in an even and improved temperature seal which is important for efficient temperature operation of the test chamber, especially for the cold chamber 22.

For example, using the cold chamber 22 and tester 20t as an example, the wall panel 20p being flush with the chamber opening means that the wall panel 20p is inserted into the chamber opening such that a front face 20pf of the wall panel 20p is adjacent an inner frame 22f of the cold chamber 22. For example, the front face 20pf of the wall panel 20p is flush with the inner frame 22f and an end edge 20pe of the wall panel 20p that is closest to the door panel 20d is flush with the chamber opening.

In an alternative embodiment, the wall panel may be sized such that it is slightly larger than the chamber opening. Accordingly, when the BIBs of the tester are inserted into the test chamber, the front face of the wall panel can be flush and adjacent to the front wall of the hot/cold chamber. The locks can then be engaged to so that the tester is held firmly in place and the wall panel forms a seal for the test chamber.

The locks can be implemented in several different ways to fix the wall panel 20p to the front wall 22w of the cold chamber 22. For example, there can be L brackets (not shown) attached on either of the side walls of the tester 20t. For example, a first face of the L bracket can be adjacent to the side wall of the tester 20t and a second face of the L bracket can be flush with the end edge 20pe of the panel 20p such that when the magazines 20m (i.e. BIBs) of the tester 20 are inserted into the test chamber 22c, the second face of the L bracket is adjacent to the front wall 22w of the cold chamber 22. Clamps (not shown) or the like on the front wall 22w on either side of the cold chamber 22 can then be actuated to releasably engage the L bracket so that the wall panel 20p makes a seal with the front wall 22w of the cold chamber 22. Alternatively, other types of locks may be used such as magnetic locks, electronic locks, hinges and bolts and the like. Alternatively, the securing means may be provided by another element such as a weight that can be placed adjacent to the front of the tester 20t to maintain it in place.

Therefore, in accordance with the teachings herein, the hot and cold chambers 18 and 22 along with the tester 20t eliminate the need for a permanent door. This is because the tester 20t along with its wall panel 20p can be used to provide a door to enclose the test chamber when the hot and cold chambers 18 and 22 are operational for testing the DUTs. Furthermore, the door panel 20d can be opened to access the DUTs. Accordingly, the hot and cold chambers 18 and 22 are doorless and have an opening for receiving a burn-in board containing the DUTs. This is in contrast with conventional testing equipment where the hot and cold chambers use either a sliding door, a bi-fold door, a single door, a double door or a multiple sectioned rolling door. The problem with these conventional built-in doors for the hot and cold chambers is that it adds more joints and more pieces for these chambers, which may cause air leaks and be harder to seal which increases cost. This is because once air begins circulating in the test chamber of the hot or cold chamber, it creates increased pressure which makes it more challenging to prevent air leakage. In addition, if a conventional hinged door is used then this takes up a large space to allow the door to be swung open and to be swung close. Furthermore, if a conventional bi-fold is used for the hinged door, then a beam will be required in the middle of the chamber opening which will require any racks that are inserted into the test chamber to be split into two separate smaller racks for insertion into the test chamber.

Advantageously, the use of the tester 20t to provide a door for the hot and cold chambers 18 and 22 during testing, in accordance with the teachings herein, simplifies the design of these chambers since a permanent door is not needed and reduces cost. In addition, since the hot and cold chambers 18 and 22 do not have doors with hinges, the hot and cold chambers 18 and 22 take up less space as a door to the ovens 18 and 22 does not have to be swung open. Furthermore, the main frame and the panel wall 20p of the tester 20t provide a jointless door for the hot and cold chambers 18 and 22 during testing and the fact that there are no joints also provides better airtight seals to prevent any air leaks during testing. This is particularly important for the cold chamber 22 when performing cold temperature cycling when testing the DUTs where any air leakage will cause frost to form, which may then melt and create moisture, which may cause circuit instability and even short circuits in some cases.

In at least some embodiments, on the exterior side of the door panel 20d, some test equipment, i.e. test cards, (not shown) can be installed that can be used to test the BIB 19 via an external connection during burn-in testing. The external test equipment can be a rack of test cards that interfaces with a rack of BIBs. The external test equipment can be enclosed within a chassis for better access and protection. This allows such a tester to become a standalone test station that operates at room temperature when used on its own and it can also be docked with a test chamber for testing in hot or cold temperature ranges during burn-in testing. Therefore, in some cases, the tester can be operated at room temperature without inserting the carrier magazines of the tester into the at least one test chamber in order to perform testing at room temperature.

The material AGV 16 is also an intelligent AGV, and can have up to about 1,000 kg of loading capacity. The material AGV 16 can have a mapping function and be pre-mapped with a laser guiding system, has built-in intelligence to avoid blockades and can analyze the best route from its current position to its destination. The material AGV 16 only needs to be provided with a command with the destination, and there is no need to fix the routes. The material AGV 16 carries out two functions: (1) to transport un-tested devices from the warehouse to the loader 14; and (2) to transport tested devices from the sorter 24 to the warehouse.

When transporting the un-tested devices from the warehouse to the loader 14, after the carrier magazines 16m are loaded onto the material AGV 16, the material AGV 16 will automatically guide itself to the loader 14 where it needs to refill the loader 14 with the loaded carrier magazines 16m according to central commands provided by the central control server 12. Once the material AGV 16 reaches the target loader 14, it will dock with the loader 14 and move the carrier magazines 16m into the carrier magazines rack of the loader 14 automatically. Meanwhile, the material AGV 16 will connect its power module to a power connector on the loader 14 and start charging the battery on the material AGV 16 to provide power for subsequent operation.

After the tested devices are binned and loaded into carrier magazines, and after a "Full for pickup" command has been issued by the central control server 12, the material AGV 16 will proceed to automatically unload the loaded carrier magazines from the sorter 24 and place empty carrier magazines into the sorter 24. The material AGV 16 will then automatically guide itself to the warehouse for unloading the loaded carrier magazines that now contain the tested devices. While docking with the sorter 24, the material AGV 16 can connect its power module to a power connector on the sorter 24 and charge the battery on the material AGV to provide power for subsequent operation.

The sorter 24 is configured to perform sorting on the tested devices based on test results stored in the BIB memory unit from the tester 20*t*. In an example embodiment, the sorter 24 can support up to 8 sorting bins and multiple soft bins according to different test categories (in other embodiments another number of bins can be supported). These sorting bins are shown as the six empty trays in FIG. 2H (note that only one section of the empty trays can be seen). However, in other embodiments, there may be capacity for more or less empty trays to serve as sorting bins. For example, the different test categories can include different grades for reliability or performance for the tested devices on the BIB 19. The sorter 24 includes an intelligent pick and place mechanism 24*p* that can be used to first select a bin for sorting, analyze the position of the test categories of the tested devices in the BIB 19, then pick up several of the devices with test results in the same test category that matches the bin selected for sorting (i.e. sorting bin) at the same time and move all of these picked up devices together from the BIB 19 to the selected sorting bin. For example, 8 or 16 devices may be picked up at the same time by the pick and place mechanism 24*p*. This results in a shorter indexing time. This is in contrast to conventional methods, which involve sequencing through each of the tested devices based on their location in the BIB one by one regardless of their test result category and putting the tested devices into the corresponding sorting bins one by one, which results in excessive traveling time for the pick and place mechanism since it has to keep switching between different sorting bins and a tested device when sorting each tested device, which subsequently results in poor (i.e. longer) indexing time since there can be larger distances between each of the sorting bins.

Figure 3:
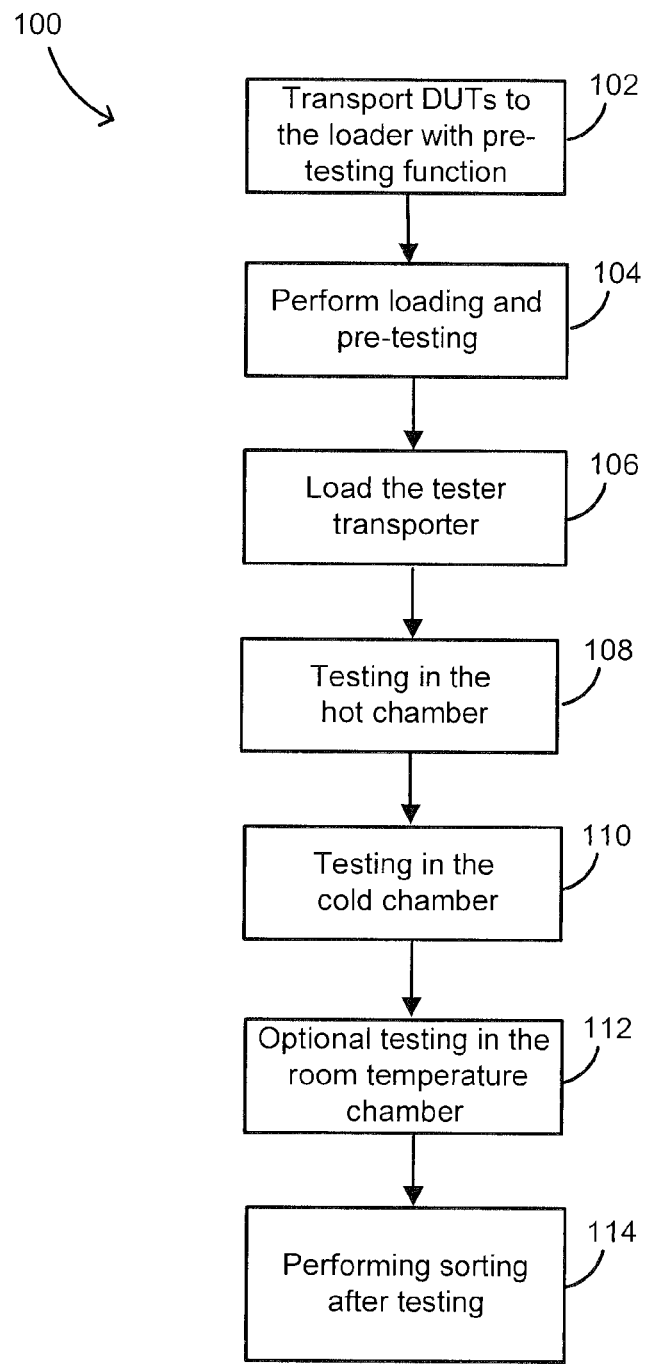
FIG. 3 is a flowchart of an example embodiment of a testing method in accordance with the teachings herein.

Referring now to FIG. 3, shown therein is a flowchart of an example embodiment of a testing method 100 in accordance with the teachings herein.

At act 102, the method 100 includes transporting the DUTs using the material transporter 16 from the warehouse to the loader 14. The material transporter 16 will dock with the loader 14 to load the carrier magazine into the loader 14. If the loader 14 has an empty carrier magazine, the material transporter 16 will first pull out the empty carrier magazine and then push back into the loader 14 a fully-loaded carrier magazine. After all loaded carrier magazines are loaded into loader 14, the material transporter 16 can move any empty carrier magazines to the warehouse for refilling with other DUTs that require testing.

At act 104, the method 100 includes performing loading and pre-testing. The loader 14 will pick DUTs from the loaded carrier magazine and insert the DUTs into DUT sockets on one of the BIBs 19 (i.e. the current BIB 19). Once the current BIB 19 is loaded with DUTs, the loader 14 will push the current BIB 19 into the tester's connector, provide the current BIB 19 with power and start pre-testing. If an over current condition (i.e. when a defective device draws more current than usual), an improperly inserted DUT or a defective DUT is detected, the loader 14 will automatically power down and replace the defective DUTs via the pick and place mechanism 14*p* and repeat the pre-testing until all DUTs have passed the pre-testing. If the same DUT socket has N consecutive failures, it will be considered as a defective DUT socket and the DUT socket will be masked off and the information will be stored as described previously. After all DUTs pass the pre-testing, the current BIB 19 will be loaded into the BIB rack of tester 20*t* and the next BIB will be inserted into the loader 14 for insertion of the next DUTs into the next BIB and the above pre-testing steps will be repeated.

At act 106, the method 100 includes loading the tester transporter 20 with the BIBs that have all of the DUTs that passed the pre-testing. For example, if there are 32 BIBs, arranged in two sections (i.e. two columns) on the tester 20*t*, once half of the BIBs (i.e. 16 BIBs) have been pre-tested and loaded into the tester 20*t*, the loader 14 will then shift the next section of BIBs and repeat the pre-testing and loading steps. When the second section of BIBs are fully tested and loaded into the tester 20*t*, the tester transporter 20 will dis-engage from the loader 14 and move to the hot chamber 18.

At act 108, the method 100 includes performing testing in the hot chamber 18. When the tester transporter 20 starts lining up with the hot chamber 18, the door in the hot chamber will open (i.e. roll up), and the tester transporter 20 will start docking with the hot chamber 18 and then anchor or lock into the hot chamber 18. Once the tester transporter 20 is lined up with the hot chamber 18, the roller 20*a* under the tester 17*t* of the tester transporter 20 will start rolling and push the carrier magazines of the tester 17*t* into the test chamber of the hot chamber 18. In addition, the insulated wall panel of the tester 17*t* is pushed against the inner frame of the hot chamber 18. After a sensor detects that the tester 17*t* is fully pushed into the hot chamber 18, a magnetic lock will be energized, and lock the tester 17*t* in place which will then act as a door for the hot chamber 18. The sensor and the magnetic lock can be located in close proximity to the chamber opening of the hot chamber 18, such as the frame of the chamber opening. The hot chamber 18 will then begin testing. Once the tester 17*t* is locked with the hot chamber 18, the moving mechanism 20*a* (i.e. rolling assembly) of the tester transporter 20 can be removed and be used to perform its next task based on a command from the central control module 12*a*, or it can be parked aside if there are no pending tasks. After the hot cycle testing is completed in the hot chamber 18, the hot chamber 18 will flush out the hot air from the test chamber to the outside environment to return the test chamber to normal room temperature. Once the hot chamber 18 is at room temperature, the tester 20*t* is ready to be picked up by the movement mechanism 20*a* of the tester transporter 20 so that it can be moved to the next test station, such as the cold chamber 22, for example.

At act 110, the method 100 includes performing testing in the cold chamber 22. When the tester transporter 20 starts lining up with the cold chamber 22, the door in the cold chamber 22 will roll up, and the tester transporter 20 will start docking with the cold chamber 22. Once the tester transporter 20 anchors to the cold chamber 22, the roller assembly (i.e. movement mechanism 20*a*) under the tester 20*t* on the tester transporter 20 will start rolling to push the tester 20*t* into the cold chamber 22. After a sensor detects that the carrier magazines 20*m* is fully pushed into the cold chamber 22 and the front face 20*pf* of the insulated wall 20*p* of the tester 20*t* is fully pushed against the inner frame 22*w* of the cold chamber 22, a magnetic lock will be energized to releasably secure the tester 20*t* as a door for the cold chamber 22. The sensor and the magnetic lock can be located in close proximity to the chamber opening of the cold chamber 22, such as the frame of the chamber opening. The cold chamber 22 will then begin testing. Once the tester 20*t* is locked with the cold chamber 22, the movement mechanism 20*a* for the tester transporter 20 can be removed and be used to perform its next task based on a command from the central control module 12*a*, or it can be parked aside if there are no pending tasks. After the cold cycle testing is completed in the cold chamber 22, the cold chamber 22 will flush out the cold air from the test chamber 22*c* to the outside environment and inject dry air into the test chamber 22*c* before it returns to normal room temperature. Once the cold chamber 22 is at room temperature, the tester 20*t* is ready to be picked up by the movement mechanism 20*a* of the tester transporter 20 so that it can be moved to the next test station for further testing or to the sorter 24 for sorting.

At act 112, the method 100 can optionally include performing testing in a room temperature chamber. For example, the hot chamber 18 can be used as a room temperature chamber by turning off its heating element. When a given tester is operating in a closed test chamber at room temperature, the DUTs will be tested in similar environment to that in which they will actually be used during normal operation where they will generate their own heat through operation and this generated heat can be used as a testing condition. The actions at act 112 are the same as those used when testing within the hot chamber 18 at act 108 except that the heating elements are turned off.

It should be noted that some of the other steps of the method 100 may be optional depending on the test requirements for the devices that are being tested.

At act 114, the method 100 includes performing sorting after testing has been completed. After going through the hot and cold (and optionally room temperature) burn-in tests, the tester 20*t* will be picked up by the tester transporter 20 and moved to the sorter 24. Once the tester 20*t* is docked with the sorter 24, the sorter 24 will start to pull out each BIB from the rack of the tester 20*t* and move it to the sorting platform of the sorter 24. After a BIB is moved to the sorting platform, the pick and place mechanism 24*p* will start selecting several of the tested DUTs at the same time from the BIB, where these selected tested DUTs have the same test result category, and move them all together to the appropriate sorting bin based on the test result category. These test results are stored on the memory unit of the BIB 19 and/or in the data store 12*d*, which can be accessed by the central control server 12 and transmitted to the sorter 24. The sorting bins are located in a sorted carrier magazine. After all of the BIBs of one section of the tester 20*t* have been sorted, the tester transporter 20 will shift the next section of BIBs that require sorting and the sorting process is repeated. Once the sorted carrier magazine is full, the material transporter 16 will come pick up the sorted carrier magazine and move it to the warehouse.

While the applicant's teachings described herein are in conjunction with various embodiments for illustrative purposes, it is not intended that the applicant's teachings be limited to such embodiments. On the contrary, the applicant's teachings described and illustrated herein encompass various alternatives, modifications, and equivalents, without departing from the embodiments described herein, the general scope of which is defined in the appended claims.

The invention claimed is:

1. A testing system for performing burn-in testing of electronic devices, wherein the system comprises:
at least one test chamber for testing the electronic devices under a test temperature range to obtain test results, the at least one test chamber being doorless and having a frame defining a chamber opening for receiving at least one burn-in board containing the electronic devices; and a tester including:
a main frame;
a plurality of carrier magazines mounted to the main frame and containing the at least one burn-in board (BIB) containing the electronic devices;
a door panel at a front end of the tester to allow for access into the tester; and
a wall panel disposed on a surface opposite the door panel,
wherein the wall panel and the main frame are releasably securably placed adjacent to the chamber opening of the at least one test chamber when the tester is loaded into the at least one test chamber to provide a jointless door for the at least one test chamber with an air and temperature seal during testing.

2. The testing system of claim 1, wherein the door panel has a power connection for connecting to the at least one burn-in board for providing power to the electronic devices.

3. The testing system of claim 1, wherein the tester further comprises one or more connections to the BIB for providing: power to the electronic devices, electrical test signals to the electronic devices and recording the test results, and the one or more connections are separate from the at least one test chamber.

4. The testing system of claim 1, wherein the tester further comprises:
a test controller that generates command signals and analyzes the test results;
N test cards that are networked with the test controller;
N multi-source power modules; and
N transfer boards to test N BIBs.

5. The testing system of claim 1, wherein the tester further comprises external test equipment for testing the at least one burn-in board via an external connection during standalone testing or during temperature testing when the tester is loaded into the at least one test chamber, wherein the external test equipment comprises one or more external test cards that interface with the at least one burn-in board in the tester.

6. The testing system of claim 5, wherein the external test equipment comprises a rack of test cards that interfaces with a rack of burn-in boards contained within the tester, the burn-in boards having individual connectors for receiving test signals.

7. The testing system of claim 5, wherein the external test equipment is enclosed within a chassis for access and protection.

8. The testing system of claim 1, wherein the wall panel comprises a layer of insulation that is adjacent to the chamber opening when the wall panel is secured during testing.

9. The testing system of claim 1, wherein the testing can be performed by the tester at room temperature without inserting the carrier magazines of the tester into the at least one test chamber.

10. The testing system of claim 1, wherein the testing system further comprises a loader with a built-in pre-tester for performing pre-testing on the electronic devices to check if the electronic devices are in a working condition before further testing in the at least one test chamber.

11. The testing system of claim 10, wherein the pre-tester is configured to perform at least one of checking when the electronic devices are properly inserted into sockets of the at least one burn-in board for testing, performing initial testing to make sure the electronic devices are not defective, performing testing for open shorts, and performing functional testing.

12. The testing system of claim 11, wherein the loader is further configured for loading the electronic devices into the sockets of the at least one burn-in board prior to performing the pre-testing.

13. The testing system of claim 12, wherein the loader comprises a pick and place mechanism that is configured to automatically replace an electronic device that fails the pre-testing with another electronic device.

14. The testing system of claim 10, wherein when testing at one of the sockets fails pretesting for N consecutive tests the socket is considered defective and is masked off from further testing.

15. The testing system of claim 14, wherein the failed socket is masked off from a functioning socket list that is stored in memory of the burn-in board and/or a data store coupled with the central control server.

16. The testing system of claim 1, wherein the testing system further comprises:
   a central control server for sending command signals and automating the operation of the testing system;
   a tester transporter for transporting the tester, the tester transporter including a movement mechanism for moving the tester transporter; and
   a sorter for receiving and sorting the tested electronic devices based on the test results.

17. The testing system of claim 16, wherein power is provided continuously to the tester after the tester has started testing, the tester being provided by power from the tester transporter or a test component that the tester has docked with.

18. The testing system of claim 16, wherein the sorter comprises an intelligent pick and place mechanism that is configured to identify several of the tested electronic devices with test results in a common test result category, pick up the identified electronic devices at the same time and place the picked-up electronic devices into a sorting bin that is associated with the common test result category.

19. The testing system of claim 16, wherein the central control server communicates wirelessly with one or more of the tester transporter, the sorter, the at least one test chamber and the tester.

20. The testing system of claim 1, wherein the at least one test chamber comprises a hot chamber and the test temperature range is a hot temperature range.

21. The testing system of claim 1, wherein the at least one test chamber comprises a cold chamber and the test temperature range is a cold temperature range.

22. The testing system of claim 1, wherein the at least one test chamber comprises a room temperature test chamber and the test temperature range is room temperature.

* * * * *